United States Patent
Wong et al.

(10) Patent No.: US 11,042,097 B1
(45) Date of Patent: Jun. 22, 2021

(54) MULTI-MIRROR UV-LED OPTICAL LITHOGRAPHY SYSTEM

(71) Applicant: Soulnano Limited, Hong Kong (HK)

(72) Inventors: Cho Hang Wong, Hong Kong (HK); Hung Hsin Hsieh, Kaohsiung (TW)

(73) Assignee: Soulnano Limited, Hong Kong (HK)

( * ) Notice: Subject to any disclaimer, the term of this patent is extended or adjusted under 35 U.S.C. 154(b) by 0 days.

(21) Appl. No.: 17/136,041

(22) Filed: Dec. 29, 2020

Related U.S. Application Data

(60) Provisional application No. 62/955,528, filed on Dec. 31, 2019.

(30) Foreign Application Priority Data

Dec. 8, 2020 (CN) .......................... 202011424542.3

(51) Int. Cl.
*G03F 7/20* (2006.01)
*G02B 17/06* (2006.01)

(52) U.S. Cl.
CPC ..... *G03F 7/70233* (2013.01); *G02B 17/0652* (2013.01); *G03F 7/702* (2013.01); *G03F 7/70075* (2013.01)

(58) Field of Classification Search
CPC .. G03F 7/70233; G03F 7/70075; G03F 7/702; G03F 7/70291; G03F 7/70191; G03F 7/7015; G03F 7/70058; G03F 7/70308; G03F 7/70116; G03F 7/70033; G03F 7/70225; G02B 17/0652; G02B 17/0615;

(Continued)

(56) References Cited

U.S. PATENT DOCUMENTS

| 5,917,590 A | 6/1999 | Greve |
| 2003/0058555 A1 | 3/2003 | Takino |
| 2007/0217193 A1* | 9/2007 | Lin .......................... F21V 7/09 362/245 |

FOREIGN PATENT DOCUMENTS

| CN | 1881091 A | 12/2006 |
| CN | 101006557 A | 7/2007 |

(Continued)

OTHER PUBLICATIONS

International Search Report and Written Opinion of corresponding PCT Application No. PCT/CN2020/141596 dated Mar. 29, 2021.

*Primary Examiner* — Mesfin T Asfaw
(74) *Attorney, Agent, or Firm* — Idea Intellectual Limited; Margaret A. Burke; Sam T. Yip

(57) ABSTRACT

An optical lithography system is provided, comprising: a polygonal structure having a central region and a central axis; an UV light source detachably disposed in the central region or at an end of the polygonal structure; a light parallelizer positioned in the polygonal structure for creating substantially parallel light rays from the UV light source exiting the polygonal structure before reaching a lithography target adjacent to an exit of the polygonal structure, which includes at least three mirrors arranged such that the first mirror receives incident light from the UV light source and reflects thereof from the first mirror towards the second mirror, the second mirror receiving the reflected light as a second incident light and reflecting thereof from the second mirror towards the third mirror to create a spiral light path from the UV light source to the lithography target with substantially parallel light incident on the lithography target.

15 Claims, 8 Drawing Sheets

(58) Field of Classification Search
CPC ...... G02B 17/0663; G02B 17/08; G21K 1/06; G03B 27/54
See application file for complete search history.

(56) References Cited

FOREIGN PATENT DOCUMENTS

| | | |
|---|---|---|
| CN | 101221281 A | 7/2008 |
| CN | 102483516 A | 5/2012 |
| CN | 103676489 A | 3/2014 |

\* cited by examiner

MULTI-MIRROR UV-LED OPTICAL LITHOGRAPHY SYSTEM

CROSS-REFERENCE TO RELATED APPLICATIONS

This application claims priorities to (1) U.S. provisional patent application No. 62/955,528 filed on Dec. 31, 2019; (2) Chinese invention patent application number 202011424542.3 filed on Dec. 8, 2020, and the disclosures of which are incorporated herein by reference in their entireties.

COPYRIGHT NOTICE

A portion of the disclosure of this patent document contains material, which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

FIELD OF THE INVENTION

The present invention relates to an optical lithography system comprising a light parallelizer positioned in a polygonal structure for creating substantially parallel light rays from a UV light source exiting the polygonal structure before reaching a lithography target adjacent to an exit of the polygonal structure. In particular, the light parallelizer includes a plurality of mirrors being arranged in such a way that the light rays from the UV light source after several reflections by the plurality of mirrors create a spiral light path with substantially parallel light incident on the lithography target.

BACKGROUND OF THE INVENTION

A wide diversity of lithography methodology, such as EUV, electronic beam, Laser Direct writing, UV optical lithography, has been discovered and used in electronic, semiconductor and biochemical usage nowadays. According to the limitation of Parallel-Beam optical lithography (resolution limit ~0.5 um), EUV and other projection lithography methods will be used in the more advanced semiconductor fabrication devices.

Mask aligner lithography (parallel-beam lithography) is still very attractive for less-critical lithography layers and is widely used for LED, display, CMOS image sensor, microfluidics and MEMS manufacturing. Mask aligner lithography is also a preferred choice the semiconductor back-end for 3D-IC, TSV interconnects, advanced packaging (AdP) and wafer-level-packaging (WLP). Mask aligner lithography is a mature technique based on shadow printing and has not much changed since the 1980s (Advanced Mask Aligner Lithography *Reinhard Voelkel; Uwe Vogler; Arianna Braman, SPIE Digital Library*). So it is still commonly used in many industries; e.g. PCB manufacturing, Panel Display, Touch panel, MEMS and biotechnology purpose. A continuous improvement in optical lithography is essential in the above applications.

UV Mercury Lamp is the main lamp source in the optical lithography system. It can produce UV-A wavelength for lithography purpose but some other unused wavelength (Infrared and some visible lights) will be generated at the same time. On the other hand, UV-LED is a single wavelength compound semiconductor electronic device. Therefore, a lot of amount of power can be eliminated by replacing UV mercury lamp with UV-LED as a UV light source in optical lithography in order to reduce the power consumption of the optical lithography system.

Furthermore, there is a bulk system for the operation of UV mercury lamp such like power supply, transformers, cooling system, optical components in order to remove those unwanted wavelengths. There is a need in the art to have improved the physical size and the cooling system of UV Lighting system. The operating cost of a semiconductor fabrication cleanroom is high; the reduction of the equipment spacing is helpful to reduce the operation cost.

SUMMARY OF THE INVENTION

Accordingly, the present invention provides a new structure of optical lithography which can provide a more compact and cost-effective Parallel-Beam lithography solution.

One aspect of the present invention provides an optical lithography system comprising:

a polygonal structure having a central region and a central axis;

an ultra-violet (UV) light source positioned in the polygonal structure, the UV light source including one or more UV light emitting diodes (LEDs) forming a plurality of UV LED modules detachably disposed in the central region or at an end of the polygonal structure;

a light parallelizer positioned in the polygonal structure for creating substantially parallel light rays from the UV light source exiting the polygonal structure before reaching a lithography target adjacent to an exit of the polygonal structure, the light parallelizer comprising:

a plurality of mirrors including at least first, second, and third mirrors arranged such that the first mirror receives incident light from the UV light source and reflects the incident light from the first mirror towards the second mirror, the second mirror receiving the reflected light as a second incident light and reflecting the second incident light from the second mirror towards the third mirror to create a spiral light path from the UV light source to the lithography target with light incident on the lithography target being substantially parallel;

wherein at least two of the first, second, and third mirrors are concave curved mirrors, the curvature of each of the two concave curved mirrors being different from each other.

In one embodiment, the one or more of the mirrors is/are selected from spherical mirrors.

In another embodiment, the optical lithography system further comprises at least a first and a second spherical mirrors, the curvature of the first spherical mirror being different from the curvature of the second spherical mirror, the curvature defined by different dimensions including a length (x) and a width (y) of a quadrilateral inscribed in a curved or substantially curved body of the mirrors, the longest diagonal line (a) and the shortest diagonal line (b) drawn between two opposite points on the largest periphery of the curved or substantially curved body of the spherical mirrors intersecting with each other at the center or central axis thereof, and an average height (h) from one side to another side of the curved or substantially curved body of the first and second spherical mirrors, the curved or substantially curved body of the first spherical mirror having a first length (x1), a first width (y1), a first longest diagonal line (a1) a first shortest diagonal line (b1), and a first average height (h1) different from a second or subsequent length (x2,3,4 . . . ), a second or subsequent width (y2,3,4 . . . ), a second or subsequent longest diagonal line (a2,3,4 . . . ), a second or subsequent shortest diagonal line (b2,3,4 . . . ), and a second or subsequent average height (h2,3,4 . . . ) of the second spherical mirror or subsequent spherical mirror to the second spherical mirror.

In other embodiment, the spiral light path is a substantially planar spiral.

In yet another embodiment, the spiral light path is a three-dimensional spiral.

In a further embodiment, the plurality of mirrors includes at least four mirrors. More specifically, the length and width of the third mirror and the length and width of the fourth mirror are greater than the length and width of the second mirror; the length and width of the second mirror are greater than the length and width of the first mirror.

In an additional embodiment, the plurality of mirrors includes at least four mirrors, and a first mirror of the plurality of mirrors has a first focal length which is smaller than a second focal length of a second mirror of the plurality of mirrors; the second focal length of the second mirror is smaller than a third focal length of a third mirror and a fourth focal length of a fourth mirror of the plurality of mirrors. The third focal length of the third mirror can be the same as or different from the fourth focal length of the fourth mirror.

In a specific embodiment, the first focal length of the first mirror is 50~200 mm; the second focal length of the second mirror is 1000~2000 mm; and the third focal length of the third mirror is 2500~3500 mm; and the fourth focal length of the fourth mirror is 2500~3500 mm.

In one embodiment, the one or more of light homogenizing modules are between mirrors.

In another embodiment, the length and width of the two mirrors disposed at the closest to the exit of the polygonal structure are greater than the length and width of the other mirrors more distal to the exit of the polygonal structure.

In an embodiment, the input electrical power and/or light intensity of each of the UV LED modules is/are adjustable.

In an embodiment, the UV light source includes a cooling system. More specifically, the cooling system is a heat sink or a fluid-cooling module.

In an embodiment, the UV light source is detachable from the polygonal structure so that it is convenient for removal and installation thereof mainly for maintenance purpose.

BRIEF DESCRIPTION OF THE DRAWINGS

Embodiments of the present invention are described in more detail hereinafter with reference to the drawings, in which.

DETAILED DESCRIPTION

Figure 1:
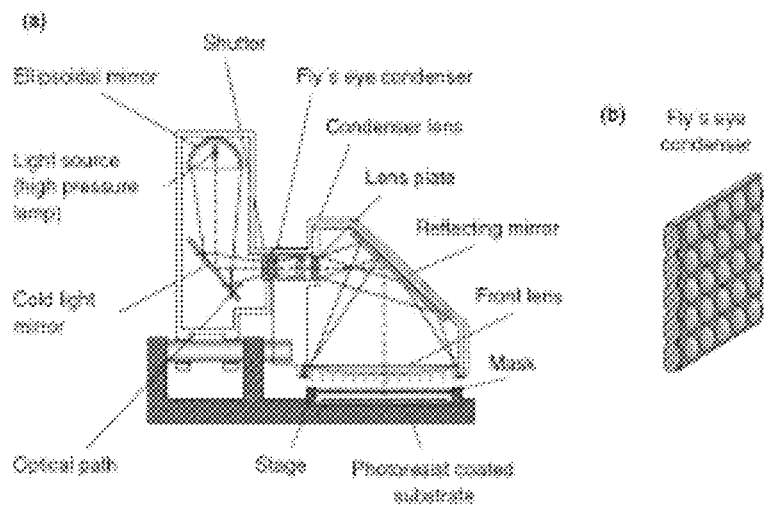
FIG. 1 shows schematically an example of a conventional lithography system using UV mercury lamp as light source.
Figure 2:
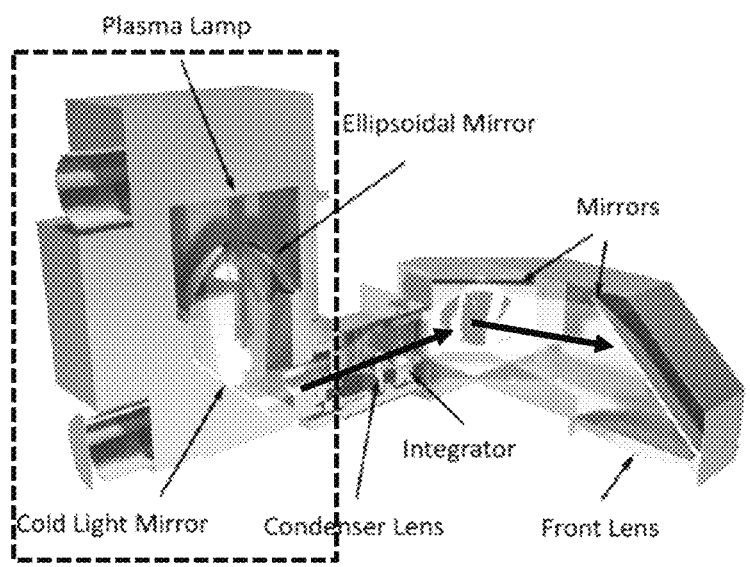
FIG. 2 shows schematically another example of a conventional lithography system using plasma lamp as light source.

FIG. 1 and FIG. 2 give two examples of the conventional design of the optical parts of a UV lithography system. In FIG. 1, a mask aligner is required substantially at the exit of light rays from the housing of the optical parts since the light rays are still not sufficiently parallel for lithography. In FIG. 2, a relatively large chamber housing a plurality of mirrors is required because the mirrors are arranged in a zigzag configuration requiring a considerable space in order to make the light rays sufficiently parallel when they exit the chamber. A larger chamber also facilitates cooling of the system because a significant amount of heat is generated by the high power light source such as UV mercury lamp or plasma lamp in the conventional lithography system. To address the afore-mentioned shortcomings in the conventional systems, one of the objectives of the present invention is to arrange or dispose the mirrors in such a way as to reduce the space required for housing the mirrors, reduce the total length of light paths between the UV source, optical components, and mirrors required for substantially parallelizing the light rays at an open end of the housing where the light rays will exit to the lithography target.

Figure 3A:
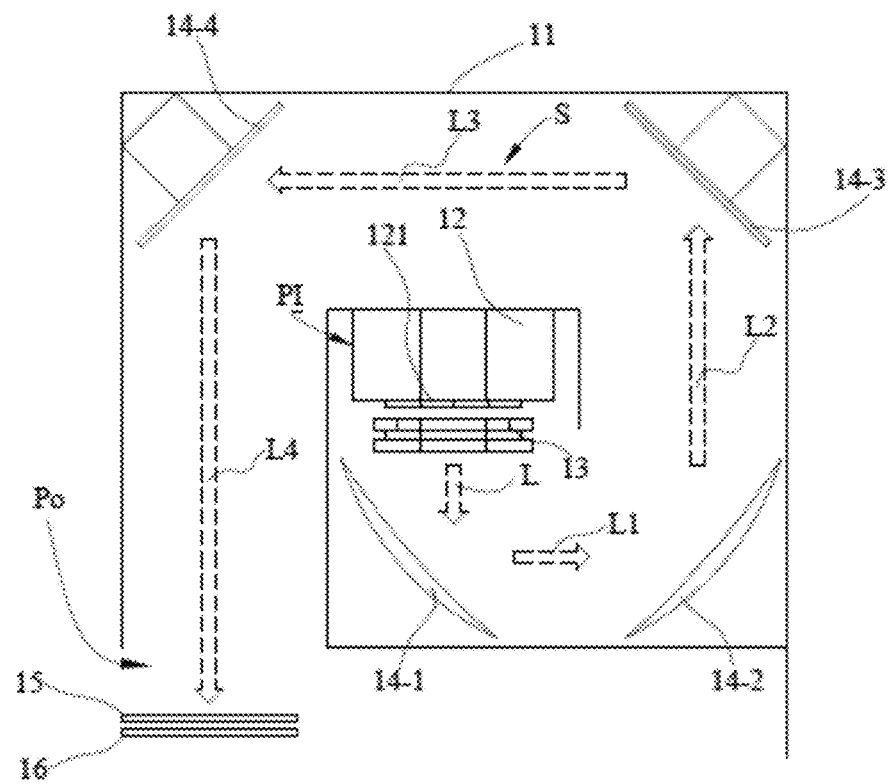
FIG. 3A depicts from a side view or top/bottom view of the optical lithography system according to an embodiment of the present invention.
Figure 5A:
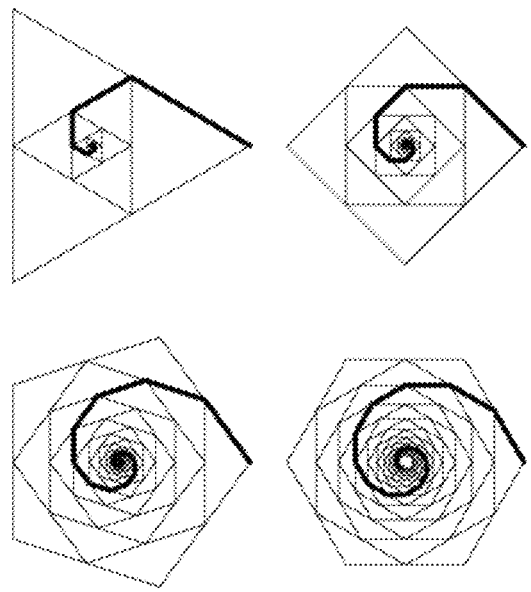
FIG. 5A shows some simulated light pathway substantially from the center to an end of a confined structure in different polygonal shapes.
Figure 5B:
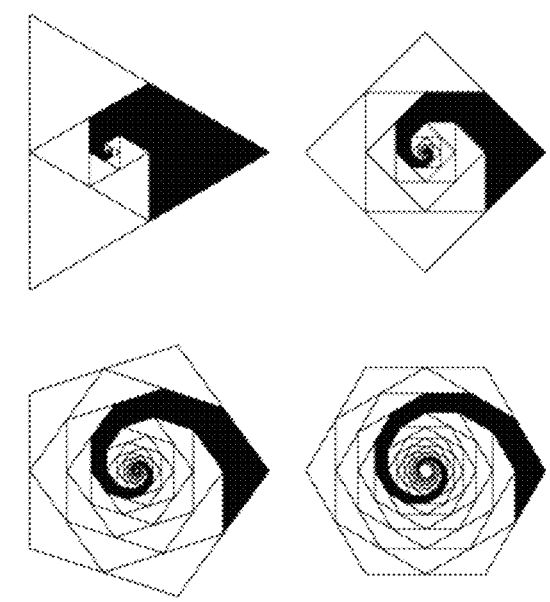
FIG. 5B shows some other simulated light pathway substantially from the center to an end of a confined structure in different polygonal shapes.

Turning to FIG. 3A, the present optical lithography system includes a semi-opened polygonal structure 11, an UV source 12 that includes an embedded cooling module such as a heat sink as a passive cooling mechanism or a fluid-based cooling system/module as an active cooling mechanism (not shown in the figure); a UV light array 121, where the UV light array can be an UV LED array; a light homogenizing module 13; and a plurality of mirrors (14-1, 14-2, 14-3, 14-4) arranged along the interior sidewall of the semi-opened polygonal structure projectively extended from substantially the center region ($P_1$) towards the periphery of the semi-opened polygonal structure until an opening ($P_O$) where the parallel light rays after a series of reflections by the mirrors exit from the semi-opened polygonal structure to reach the target of lithography. The progression of the arranged mirrors in this embodiment is similar to a "toilet roll" or "snail's shell" from the side view or top/bottom view (depending on the orientation of the optical lithography system, whether it is vertically or horizontally oriented), or it may be known as a spiral shaped progression. As used herein, the term "spiral" means the path of a point in a plane or in three dimensions moving around a central point while continuously diverging from or approaching it. As seen in FIG. 3A, the combined light path of L, L1, L2, L3, and L4 form an approximately square spiral from the source 12 to the substrate 16 for exposure through mask 15 and target of lithography (e.g. silicon wafer) 16. FIGS. 5A and 5B provide some examples of spiral shaped interior sidewall projectively extended from the center towards the periphery of a polygonal structure. It should be understood that these examples are not intended to limit the shape of the progression of the arranged mirrors in a semi-opened polygonal structure, but may just be adopted in some of the embodiments of the present invention for illustration purpose.

According to the example in FIG. 3A, UV light rays L emitted from the UV source 12 through the light homogenizing module 13 incident to the first mirror 14-1 and reflected thereby to be incident L1 to the second mirror 14-2. The light rays are subsequently reflected by the second mirror 14-2 to become incident L2 to the third mirror 14-3. The lights rays are thereby subsequently reflected by the third mirror 14-3 to become incident L3 to the fourth mirror 14-4. The light rays are then reflected by the fourth mirror 14-4 to travel along the space until reaching the open end of the semi-opened polygonal structure where the target of lithography 15, 16, is disposed. In this embodiment, the first, second, third and fourth mirrors (14-1, 14-2, 14-3, 14-4) can be any two or more of flat mirrors, spherical mirrors (including converging and diverging mirrors), and non-spherical mirrors.

Light homogenizing module 13 is disposed between the UV source 12 and the first mirror 14-1 in the embodiment shown in FIG. 3A. Light rays passing through the light homogenizing module 13 can enhance homogeneity of the light. Light homogenizing module 13 can also be disposed between any pair of mirrors. In this embodiment, the light homogenizing module 13 is an integrator. In some other embodiments, the light homogenizing module 13 can be fly-eye lens or alike.

Figure 3B:
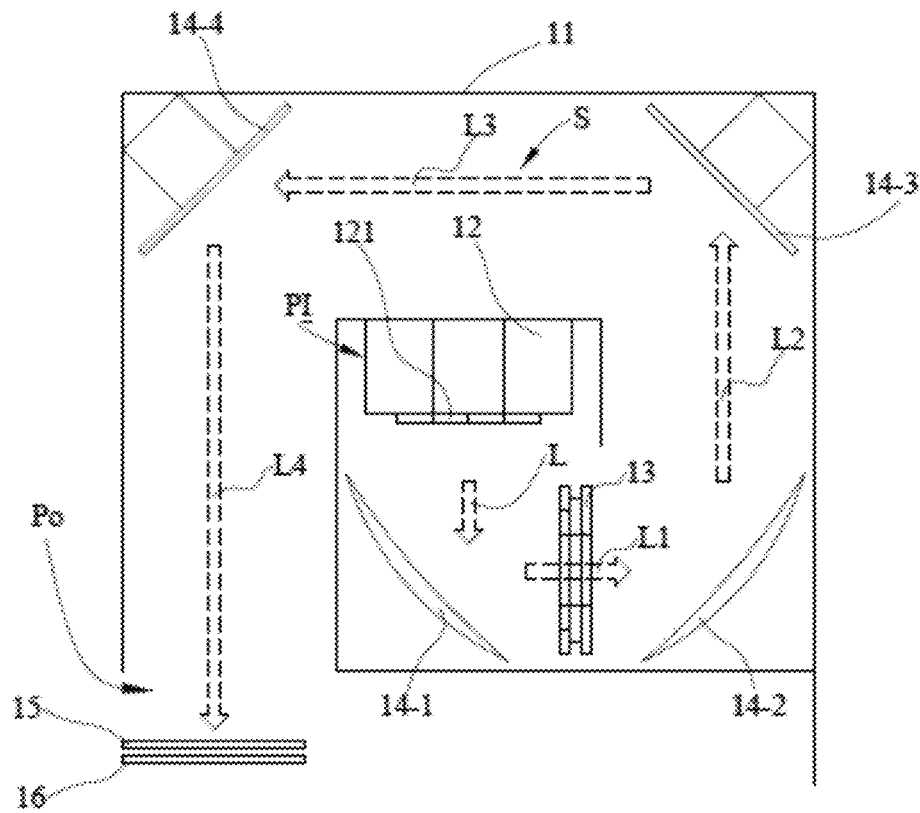
FIG. 3B depicts from a side view or top/bottom view of the optical lithography system according to another embodiment of the present invention.

Turning to FIG. 3B, the light homogenizing module 13 is disposed between the first 14-1 and second 14-2 mirrors.

Figure 3C:
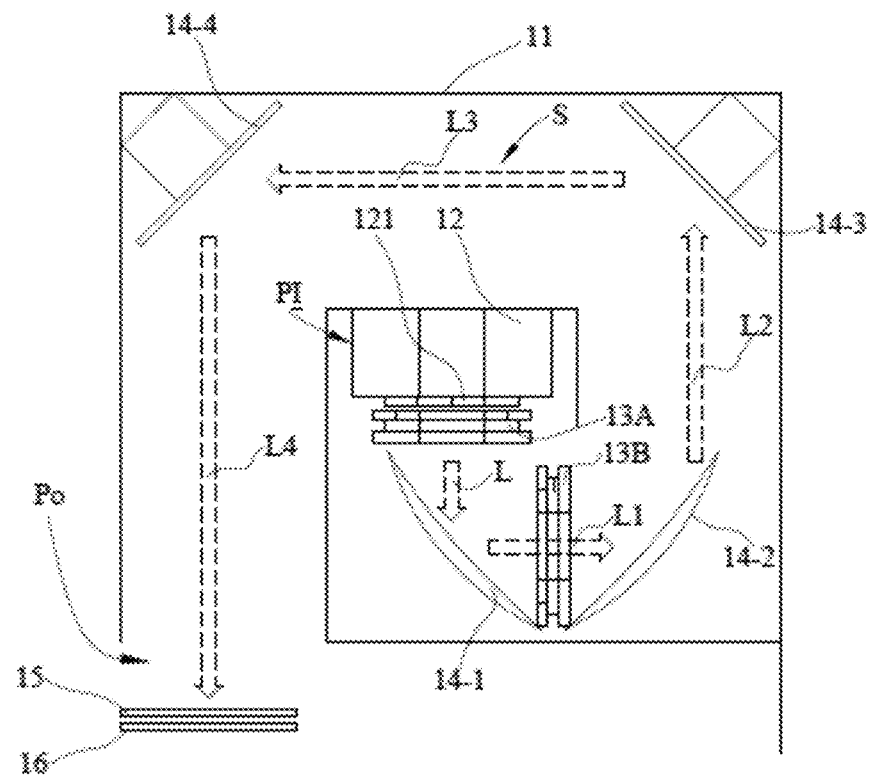
FIG. 3C depicts from a side view or top/bottom view of the optical lithography system according to other embodiment of the present invention

Turning to FIG. 3C, two light homogenizing modules (13A, 13B) are provided in this embodiment. A first light homogenizing module 13A is disposed between the UV source 12 and the first mirror 14-1 while a second light homogenizing module 13B is disposed between the first mirror 14-1 and the second mirror 14-2.

Figure 4:
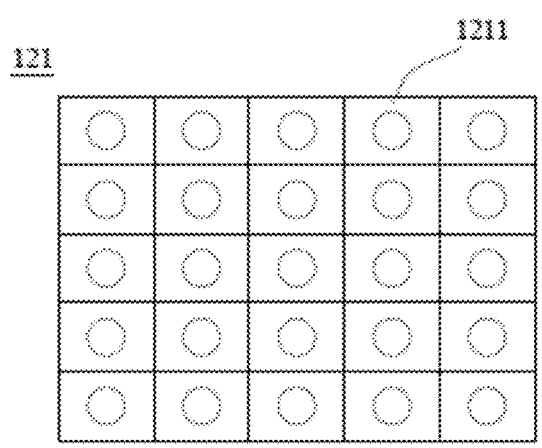
FIG. 4 depicts the top/bottom view of an UV LED array used in the optical lithography system according to an embodiment of the present invention.

Turning to FIG. 4, the UV source 12 includes a UV light array 121, where the UV light array can be an UV LED array. In this embodiment, UV light array 121 includes a plurality of UV light modules 1211 that are formed in a matrix. A plurality of UV LED chips is embedded in each of the UV light modules 1211. In this example, 5×5=25 pcs of UV light modules 1211 are used to form an UV light array 121 in this embodiment. Each UV light module 1211 can be individually controlled and its electrical power level (0-100%) can be adjusted by pulse with modulation or other similar methods. This individual controlling function shall improve the light uniformity emitted from the UV source 12 and reduce the power consumption of the whole system. In addition, the UV source 12 can be moved horizontally that is for maintenance purpose. In other embodiment, the UV source 12 can be UV mercury lamp or alike.

Turning to FIGS. 5A and 5B, some examples of the pattern of the spiral pathway in regular polygons are provided. These are only examples for illustration purpose and are not intended to give any limitation effect on the present invention, in particular, the arrangement of the plurality of mirrors in the semi-opened polygonal structure of the optical lithography system.

Figure 6A:
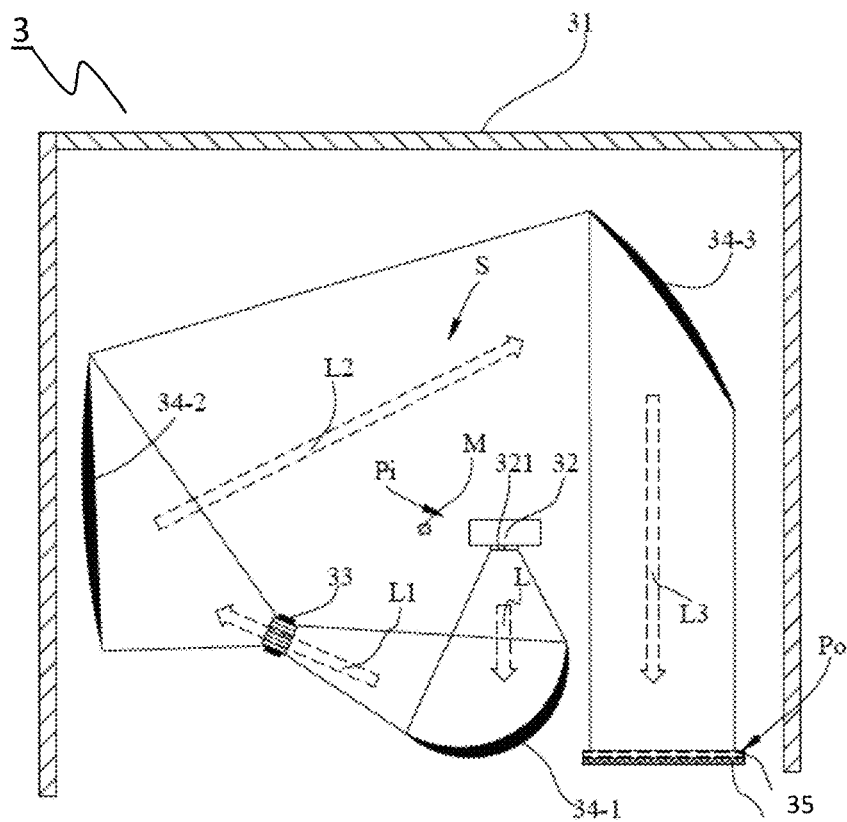
FIG. 6A depicts the light pathway from an UV LED array along a plurality of mirrors arranged along a projective interior sidewall of the semi-opened polygonal structure (the projective interior sidewall is not shown) of the optical lithography system according to an embodiment of the present invention.

Turning to FIG. 6A, the structure of the semi-opened polygonal structure 3 according to an embodiment of the present invention is depicted. The semi-opened polygonal structure 3 in this embodiment has a housing 31, UV source 32 comprising a light array 321, light homogenizing module 33 and a plurality of mirrors (34-1, 34-2, 34-3). Pi is the starting point where the UV source 32 is disposed and Po is where the light exits the semi-opened polygonal structure 3. Pi is located substantially at one point along the central axis M of the spiral pathway S of the light rays. In FIG. 6A, a first mirror 34-1, a second mirror 34-2, a third mirror 34-3, and the UV source 32 are configured such that the center of each of the first, second and third mirrors (34-1, 34-2, 34-3) and the center of the UV source 32 are substantially disposed along the spiral pathway S of the light rays at the same horizontal plane. The length and width of the second and third mirrors (34-2, 34-3) are larger than those of the first mirror 34-1; whereas the height of the first mirror 34-1 is larger than the respective height of the second and third mirrors (34-2, 34-3). Light homogenizing module 33 is disposed along the light pathway between the first and second mirrors (34-1, 34-2).

In operation, the UV source 32 in FIG. 6A generates a UV light L which is incident to the first mirror 34-1, then a first reflected light L1 is generated from reflection by the first mirror 34-1 and first reaches the light homogenizing module 33 before being incident to the second mirror 34-2. The second mirror 34-2 reflects the first reflected light L1 and generates a second reflected light L2. The second reflected light L2 travels along the spiral pathway S from the second mirror 34-2 to the third mirror 34-3. A third reflected light L3 is thereby generated from reflection by the third mirror 34-3 followed by travelling along the spiral pathway until reaching Po to exit the semi-opened polygonal structure 3 in order to illuminate a mask 35 for lithography of the target 36. Because of this configuration, light rays travelling distance from Pi until Po through the spiral pathway S is significantly reduced as compared to traditional UV mask aligner or similar lithography system. The reduction in travelling distance of the UV light rays from the source to the target also benefits the saving of the power to generate the light for lithography and cost involved.

Figure 6B:
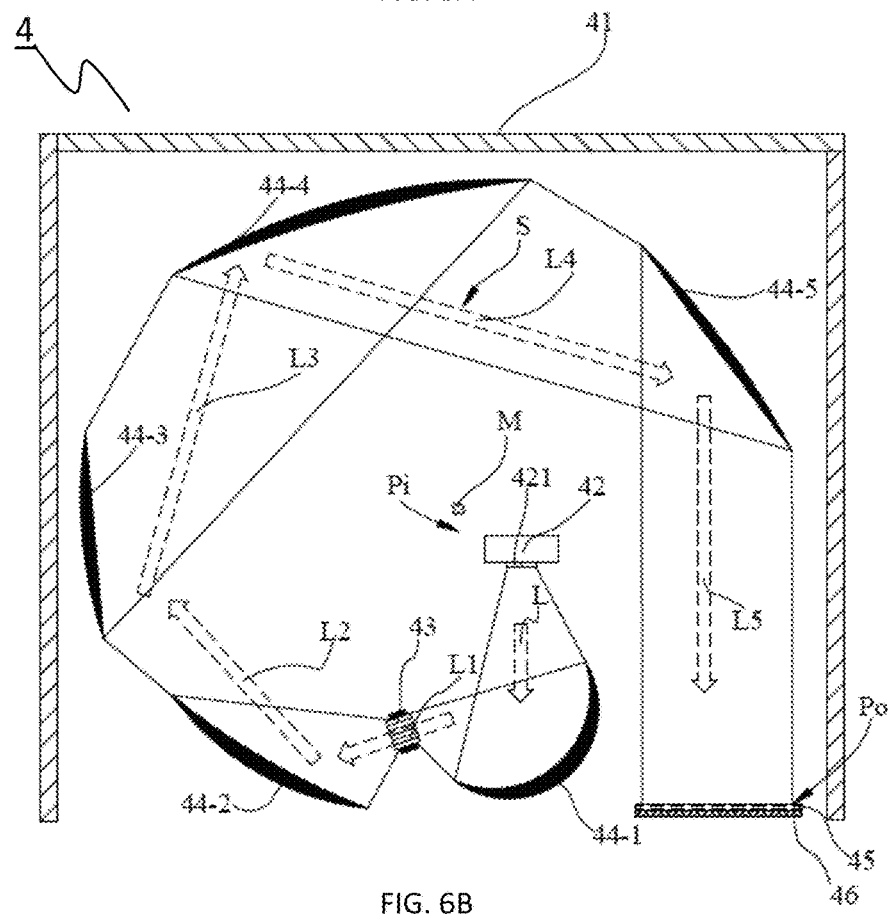
FIG. 6B depicts the light pathway from an UV LED array along a plurality of mirrors within the semi-opened polygonal structure (the projective interior sidewall is not shown) of the optical lithography system according to another embodiment of the present invention.

Turning to FIG. 6B, it shows the structure of the semi-opened polygonal structure 4 according to another embodiment of the present invention. The semi-opened polygonal structure 4 in this embodiment has a housing 41, UV source 42 comprising a light array 421, light homogenizing module 43 and a plurality of mirrors (44-1, 44-2, 44-3, 44-4, 44-5). Pi is the starting point where the UV source is disposed and Po is where the light exits the semi-opened polygonal structure 4. Pi is located substantially at one point along the central axis M of the spiral pathway S of the light rays. In FIG. 6B, a first mirror 44-1, a second mirror 44-2, a third mirror 44-3, a fourth mirror 44-4, a fifth mirror 44-5 and the UV source 42 are configured such that the center of each of the first, second, third, fourth and fifth mirrors (44-1, 44-2, 44-3, 44-4, 44-5) and the center of the UV source 42 are substantially disposed along the spiral pathway S of the light rays at the same horizontal plane. The length and width of the fourth and fifth mirrors (44-4, 44-5) are larger than those of the rest of the mirrors; whereas the height of the first mirror 44-1 is larger than the respective height of the rest of the mirrors. Light homogenizing module 43 is disposed along the light pathway between the first and second mirrors (44-1, 44-2).

In operation, the UV source 42 in FIG. 6B generates a UV light L which is incident to the first mirror 44-1, then a first reflected light L1 is generated from reflection by the first mirror 44-1 and first reaches the light homogenizing module 43 before being incident to the second mirror 44-2. The second mirror 44-2 reflects the first reflected light L1 and generates a second reflected light L2. The second reflected light L2 travels along the spiral pathway S from the second mirror 44-2 to the third mirror 44-3. A third reflected light L3 is thereby generated from reflection by the third mirror 44-3 and the third reflected light L3 is incident to the fourth mirror 44-4. A fourth reflected light L4 is thereby generated from reflection by the fourth mirror 44-4 and the fourth reflected light L4 is incident to the fifth mirror 44-5, followed by travelling along the spiral pathway until reaching Po to exit the semi-opened polygonal structure 4 in order to illuminate a mask 45 for lithography of the target 46. Because of this configuration, light rays travelling distance from Pi until Po through the spiral pathway S is significantly reduced as compared to traditional UV mask aligner or similar lithography system. The reduction in travelling distance of the UV light rays from the source to the target also benefits the saving of the power to generate the light for lithography and cost involved.

Figure 6C:
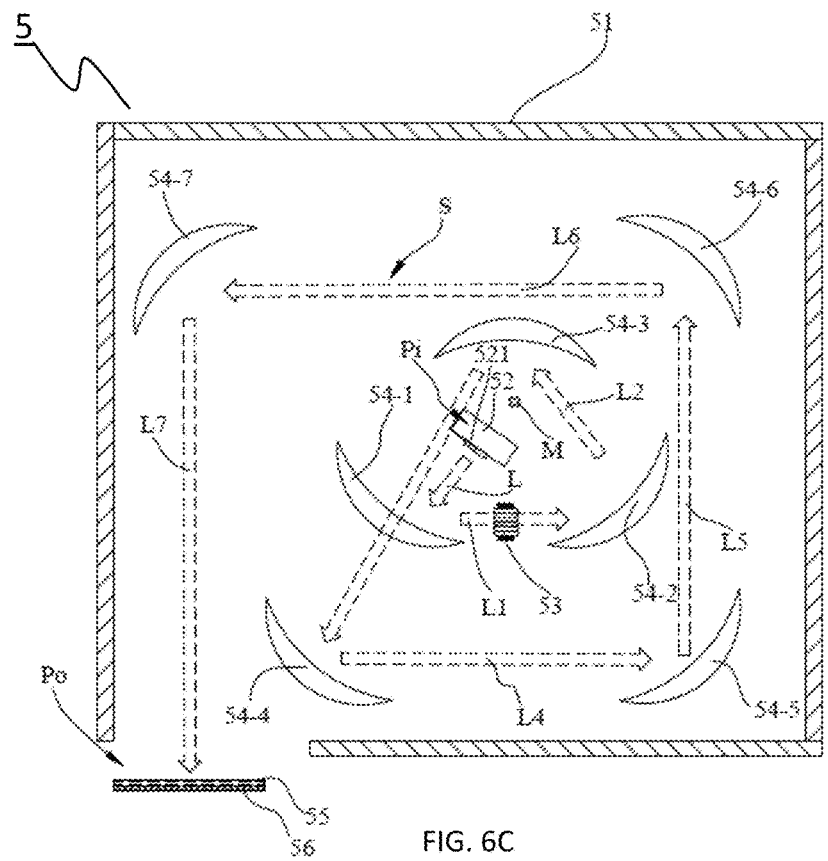
FIG. 6C depicts the light pathway from an UV LED array along a plurality of mirrors within the semi-opened polygonal structure (the projective interior sidewall is not shown) of the optical lithography system according to other embodiment of the present invention.

Turning to FIG. 6C, it shows the structure of the semi-opened polygonal structure 5 according to other embodiment of the present invention. The semi-opened polygonal structure 5 in this embodiment has a housing 51, UV source 52 comprising a light array 521, light homogenizing module 53 and a plurality of mirrors (54-1, 54-2, 54-3, 54-4, 54-5, 54-6, 54-7). Pi is the starting point where the UV source 52 is disposed and Po is where the light exits the semi-opened polygonal structure 5. Pi is located substantially at one point along the central axis M of the spiral pathway S of the light rays. In FIG. 6C, the plurality of mirrors (54-1, 54-2, 54-3, 54-4, 54-5, 54-6, 54-7) can be converging mirrors. In yet another embodiment, any one of the plurality of mirrors can be substituted by any one of plane mirror, diverging mirror and non-spherical mirror; or the plurality of mirrors may include any two of plane mirror, diverging mirror and non-spherical mirror.

The first mirror 54-1, second mirror 54-2, third mirror 54-3, fourth mirror 54-4, fifth mirror 54-5, sixth mirror 54-6, seventh mirror 54-7 are configured to be disposed along the spiral pathway S of light rays, wherein the vertical position of the first mirror 54-1 is lower than the vertical position of the second mirror 54-2 with respect to their heights from their respective center to the bottom of the semi-opened polygonal structure 5. Similarly, the vertical position of the second mirror 54-2 is lower than the vertical position of the third mirror 54-3 with respect to their heights from their respective center to the bottom of the semi-opened polygonal structure 5. In this embodiment, the higher the order of the mirror, the higher is the mirror disposed within the semi-opened polygonal structure 5 with respect to their height from their respective center to the bottom of the semi-opened polygonal structure 5. In this embodiment, the semi-opened polygonal structure provides a spiral shaped 3-dimensional light pathway originated from a center or one end of the semi-opened polygonal structure 5 where the UV source is disposed to the periphery or another end of the semi-opened polygonal structure such that the light rays travelling along the spiral shaped 3-dimensional light pathway with the assistance by the plurality of mirrors being arranged substantially in parallel with the spiral shaped 3-dimensional light pathway. In other words, the plurality of mirrors in this embodiment is arranged along a projective interior sidewall in a polygonal spiral shape extended from the center or one end to the periphery or another end of the semi-opened polygonal structure for parallelizing light rays incident from the UV source to result in substantially parallel light rays travelling away from the UV source to exit the semi-opened polygonal structure in order to reach the mask 55 and the target for lithography 56.

Figure 6D:
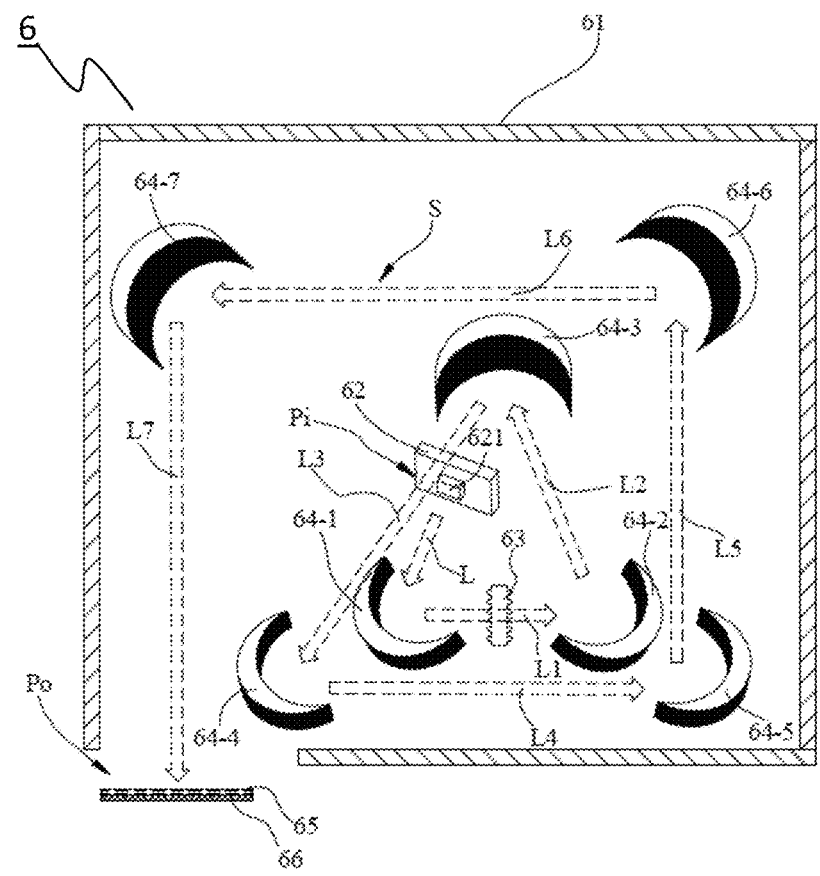
FIG. 6D depicts the light pathway from an UV LED array along a plurality of mirrors within the semi-opened polygonal structure (the projective interior sidewall is not shown) of the optical lithography system according to yet another embodiment of the present invention.

Turning to FIG. 6D, it shows the structure of the semi-opened polygonal structure 6 according to other embodiment of the present invention. The semi-opened polygonal structure 6 in this embodiment has a housing 61, UV source 62 comprising a light array 621, light homogenizing module 63 and a plurality of mirrors (64-1, 64-2, 64-3, 64-4, 64-5, 64-6, 64-7). Pi is the starting point where the UV source 62 is disposed and Po is where the light exits the semi-opened polygonal structure 6. Pi is located substantially at one point along the central axis M of the spiral pathway S of the light rays. In FIG. 6D, the plurality of mirrors (64-1, 64-2, 64-3, 64-4, 64-5, 64-6, 64-7) can be converging mirrors. In yet another embodiment, any one of the plurality of mirrors can be substituted by any one of plane mirror, diverging mirror and non-spherical mirror; or the plurality of mirrors may include any two of plane mirror, diverging mirror and non-spherical mirror.

The first mirror 64-1, second mirror 64-2, third mirror 64-3, fourth mirror 64-4, fifth mirror 64-5, sixth mirror 64-6, seventh mirror 64-7 are configured to be disposed along the spiral pathway S of light rays, wherein the first mirror 64-1, the second mirror 64-2, and the UV source 62 are disposed at the same vertical position within the semi-opened polygonal structure while their vertical position is lower than that of the third mirror 64-3. In other words, the first mirror 64-1, the second mirror 64-2, and the UV source 62 are disposed at the same horizontal plane within the semi-opened polygonal structure while the third mirror 64-3 is disposed at the different horizontal plane from that of the first, second mirrors (64-1, 64-2) and the UV source 62 within the semi-opened polygonal structure 6. In this embodiment, starting from the third mirror 64-3, the higher the order of the mirror, the higher is the mirror disposed within the semi-opened polygonal structure 6 with respect to their height from their respective center to the bottom of the semi-opened polygonal structure 6. For example, the vertical position of the fourth mirror 64-4 is higher than that of the third mirror 64-3; the vertical position of the fifth 64-5 is higher than that of the fourth mirror 64-4. The light rays travelling away from the UV source 62 through reflections by the plurality of mirrors (64-1, 64-2, 64-3, 64-4, 64-5, 64-6, 64-7) that the light ray were parallelized by mirrors, disposed along the projective interior sidewall of the semi-opened polygonal structure until they reach the exit of the semi-opened polygonal structure where the mask 65 and the target of lithography 66 are disposed.

Figure 6E:
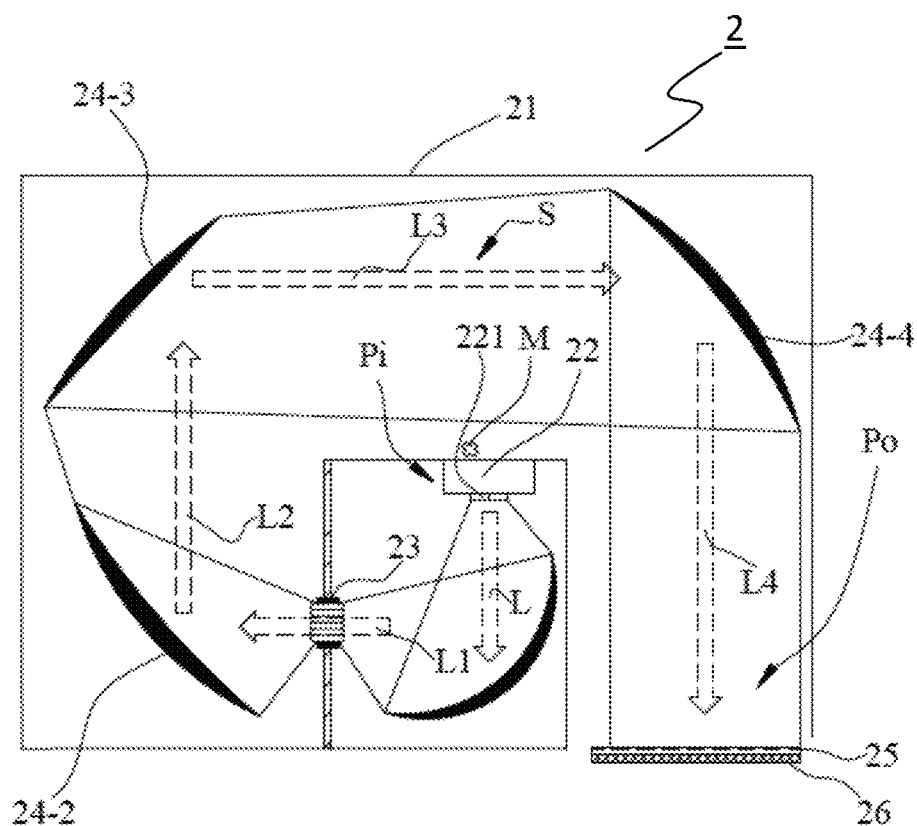
FIG. 6E depicts the light pathway from an UV LED array along a plurality of mirrors within the semi-opened polygonal structure of the optical lithography system according to a further embodiment of the present invention.

FIG. 6E illustrates a further embodiment of the semi-opened polygonal structure where there are four mirrors (24-1, 24-2, 24-3, 24-4) arranged in such a way to generate a spiral pathway of light rays originated from the UV source 22 through a light array 221 disposed at the center M of the semi-opened polygonal structure as the starting point Pi. The light L from the UV source 22 is incident to the first mirror 24-1 and then reflected to become a first reflected light L1. The first reflected light L1 is incident to the second mirror 24-2 through a light homogenizing module 23 disposed between the first and the second mirrors (24-1, 24-2) in order to generate a second reflected light L2. The second reflected light L2 is then incident to the third mirror 24-3 to generate a third reflected light L3. The third reflected light L3 is then incident to the fourth mirror 24-4 to generate a fourth reflected light L4. The fourth reflected light L4 will travel along the outermost space from the center M of the semi-opened polygonal structure until it exits the semi-opened polygonal structure at Po to reach the mask 25 and the target 26 of lithography adjacent to the exit Po of the semi-opened polygonal structure. The mirrors in this embodiment are arranged in substantially the same vertical position or horizontal plane in the semi-opened polygonal structure. It should be understood that the arrangement of the mirrors within the semi-opened polygonal structure is not confined to the same vertical level or on the same horizontal plane, but depends on the shape of the semi-opened polygonal structure, and/or the requirements for lithography of the target at the exit. The following embodiments will take the embodiment as shown in FIG. 6E to depict how to select and combine different mirrors with different dimensions to result in a desired output for lithography of an intended target.

Figure 7A:
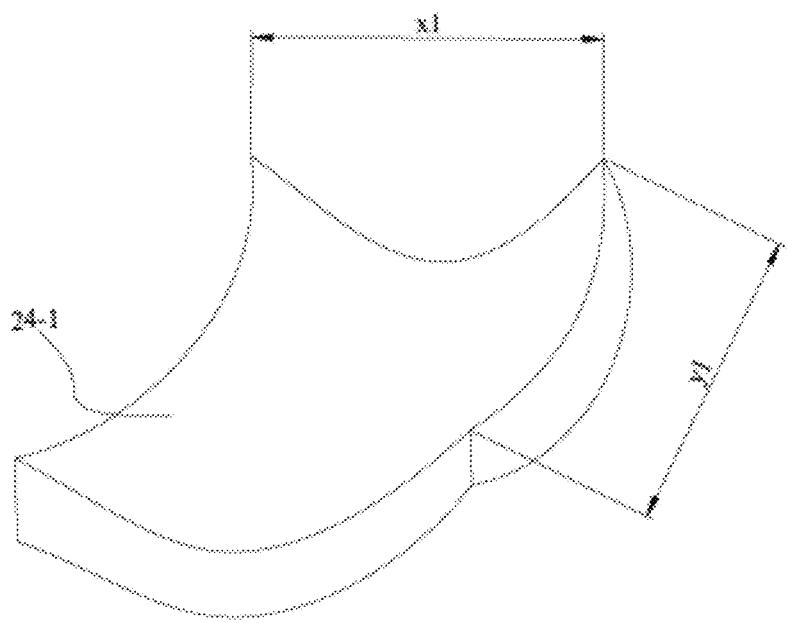
FIG. 7A depicts in perspective view how the curvature of the mirrors of the present invention is defined in terms of their curvature with respect to different lengths and widths (heights not shown in this figure) inscribed in the mirrors (24-1)

Turning to FIG. 7A, it shows schematically from a perspective view of a first spherical mirror 24-1 used in the embodiment as shown in FIG. 6E, where x1 and y1 represent length and width, respectively, of an inscribed quadrilateral where four corners of the inscribed quadrilateral touch the largest periphery of the curved body of the first spherical mirror 24-1.

Figure 7B:
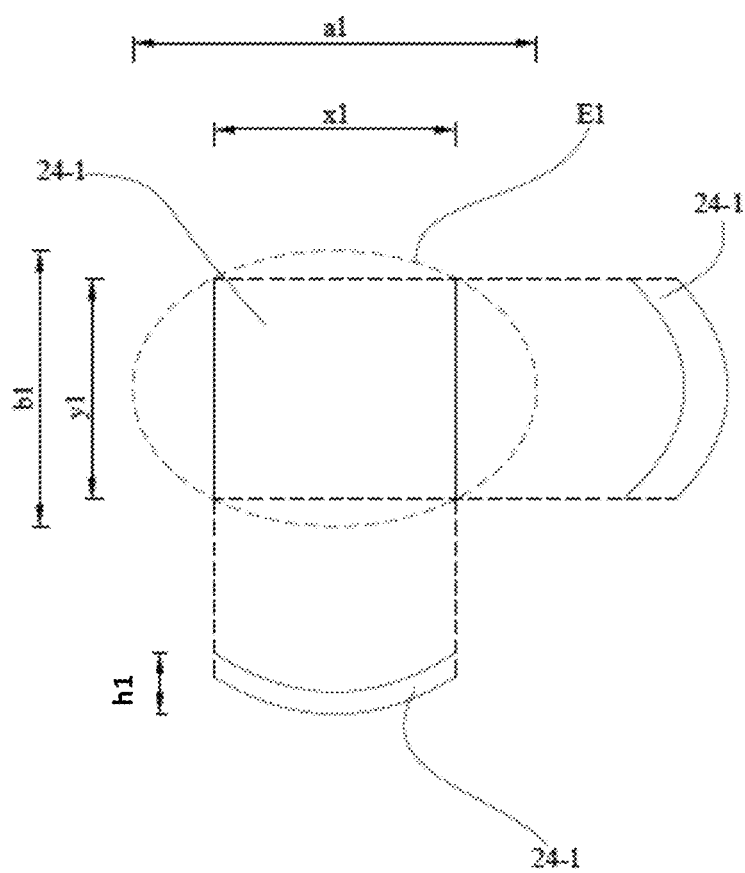
FIG. 7B depicts schematically how the curvature of the mirrors of the present invention is defined in terms of their curvature with respect to different lengths, widths and heights inscribed in the mirrors.

Turning to FIG. 7B, it illustrates that curvature of a mirror which can be defined in terms of different lengths and widths of the curved body of the mirror. For example, a and b represent the longest and the shortest intersecting lines, respectively, between two opposite points on the periphery of the curved body of the mirror. In an embodiment where a first mirror 24-1 is a spherical mirror with an eclipse body E1, a1 and b1 represent the longest and shortest diagonal lines between two opposite points on the periphery of a spherical mirror where two diagonal lines can intersect with each other substantially at the center of the eclipse body of the spherical mirror. x1 and y1 are length and width, respectively, of the inscribed quadrilateral where four corners thereof touch on four different points of the periphery of the eclipse body of the spherical mirror. The average thickness or height from one side to another side of the spherical mirror, in particular, the height from one side to another side at the central axis of the spherical mirror is defined as h1 for the first mirror 24-1. Different mirrors used in the present invention may have different dimensions, shapes and curvatures. The following Table 1 gives some examples:

TABLE 1

| Dimension (mm) | Mirror Sample | | | |
|---|---|---|---|---|
| | 24-1 | 24-2 | 24-3 | 24-4 |
| $a_{1,2,3,4...}$ | 800 | 900 | 920 | 1100 |
| $b_{1,2,3,4...}$ | 800 | 900 | 920 | 1100 |
| $h_{1,2,3,4...}$ | 150 | 10 | 10 | 15 |
| $x_{1,2,3,4...}$ | 450 | 500 | 700 | 850 |
| $y_{1,2,3,4...}$ | 450 | 500 | 600 | 600 |

In Table 1, the dimension of the longest and shortest diagonal lines (a1, b1) of the first mirror 24-1 is smaller as that of the longest and shortest diagonal lines (a2, b2) of the second mirror 24-2. Similarly, the dimension of the longest and shortest diagonal lines (a2, b2) of the second mirror 24-2 is smaller than that of the longest and shortest diagonal lines (a3, b3) of the third mirror 24-3; the dimension of the longest and shortest diagonal lines (a3, b3) of the third mirror 24-3 is smaller than that of the longest and shortest diagonal lines (a4, b4) of the fourth mirror 24-4.

The length x1 and width y1 of the inscribed quadrilateral defined within the eclipse body of the first mirror 24-1 are smaller than the length x2 and width y2 of the inscribed quadrilateral defined within the eclipse body of the second mirror 24-2 in this example. Similarly, the length x2 and width y2 of the inscribed quadrilateral defined within the eclipse body of the second mirror 24-2 are smaller than the length x3 and width y3 of the inscribed quadrilateral defined within the eclipse body of the third mirror 24-3. In this example, the length x3 of the inscribed quadrilateral within the eclipse body of the third mirror 24-3 is smaller than the length x4 of the inscribed quadrilateral within the eclipse body of the fourth mirror 24-4, but the width y3 of the inscribed quadrilateral within the eclipse body of the third mirror 24-3 is the same as the width y4 of the inscribed quadrilateral within the eclipse body of the fourth mirror 24-4.

The height h1 of the first mirror 24-1 is much larger than the height (h2, h3, h4) of the rest of the mirrors (24-2, 24-3, 24-4), and the height h4 of the fourth mirror 24-4 is slightly larger than the height (h2, h3) of the second and third mirrors (24-2, 24-3), respectively.

In general, the first mirror 24-1 has a focal length of 50-200 mm; the second mirror 24-2 has a focal length of 1,000-2,000 mm; the third mirror 24-3 has a focal length of 2,500-3,500 mm; the fourth mirror 24-4 also has a focal length in a range of 2,500-3,500 mm.

In one embodiment, the first mirror 24-1 has a focal length of 90-160 mm; the second mirror 24-2 has a focal length of 1,200-1,800 mm; the third mirror 24-3 has a focal length of 2,700-3,300 mm; the fourth mirror 24-4 has a focal length of 2,700-3,000 mm.

In another embodiment, the first mirror 24-1 has a focal length of 100-130 mm; the second mirror 24-2 has a focal length of 1,400-1,600 mm; the third mirror 24-3 has a focal length of 2,900-3,100 mm; the fourth mirror 24-4 has a focal length of 2,900-3,100 mm. More specifically, the first mirror 24-1 has a focal length of 122 mm; the second mirror 24-2 has a focal length of 1,565 mm; the third mirror 24-3 has a focal length of 3,065 mm; the fourth mirror 24-4 has a focal length of 3,014 mm.

To summarize the result in Table 1, a1<a2, a3, a4; b1<b2, b3, b4; x1<x2<x3, x4; and y1<y2<y3, y4; h1>h2, h3, h4. It is noteworthy that there is no specific order for different dimensions of the mirrors within the semi-opened polygonal structure. This example is just for illustration purpose.

Selection and combination of different mirrors with different curvatures depends on the arrangement of the multiple mirrors within the semi-opened polygonal structure, shape and dimension of the semi-opened polygonal structure, and/or specific requirements for lithography of the target such as the intensity of the output. The afore-mentioned embodiments and corresponding figures are intended for illustration purpose, and should not be considered as limiting the scope of the invention. The intended scope of the invention should be referred to the appended claims.

The foregoing description of the present invention has been provided for the purposes of illustration and description. It is not intended to be exhaustive or to limit the invention to the precise forms disclosed. Many modifications and variations will be apparent to the practitioner skilled in the art. The embodiments were chosen and described in order to best explain the principles of the invention and its practical application, thereby enabling others skilled in the art to understand the invention for various embodiments and with various modifications that are suited to the particular use contemplated.

INDUSTRIAL APPLICABILITY

The present invention is applicable to lithography system from small to large scale while physical space for housing the equipment, optical components, energy level of the light source, complexity of the configuration, etc., are significantly reduced. Quality of the output light for lithography is also improved compared to conventional UV mask aligner design. Varying the number of mirrors, incorporating various types of mirrors, and maintenance of the optical components in the present invention are also easily achievable because it is less labor intensive and more cost-effective to replace and/or vary the components in the present invention. Because some conventional lithography systems utilize mercury lamp as light source which output cannot be adjusted, limiting the application of the systems, the present invention provides certain flexibilities of using UV LED as the light source which is easily adjustable in terms of the output where the output can be adjusted by power modification of each UV LED module on the UV LED array. The present invention also avoids the use of bulky cooling mechanism as in most of conventional lithography systems using mercury lamp as light source because the heat generated by the UV LED is much lower than that by mercury lamp so that an embedded cooling system inside the UV LED source is sufficient for the cooling purpose. The spiral arrangement of the mirrors within the semi-opened polygonal structure of the present invention also provides flexibility of configuring the optical part of the lithography system not only adjacent to the core of the lithography system but also within the core of lithography system. Due to the absence of cooling mechanism, the present invention can be easily scaled up and down, and can also lower the operational cost.

What is claimed is:

1. An optical lithography system comprising:
a polygonal structure having a central region and a central axis;
an ultra-violet (UV) light source positioned in the polygonal structure, the UV light source including one or more UV light emitting diodes (LEDs) forming a plurality of UV LED modules detachably disposed in the central region or at an end of the polygonal structure;
a light parallelizer positioned in the polygonal structure for creating substantially parallel light rays from the UV light source exiting the polygonal structure before reaching a lithography target adjacent to an exit of the polygonal structure, the light parallelizer comprising:
a plurality of mirrors including at least first, second, and third mirrors arranged such that the first mirror receives incident light from the UV light source and reflects the incident light from the first mirror towards the second mirror, the second mirror receiving the reflected light as a second incident light and reflecting the second incident light from the second mirror towards the third mirror to create a spiral light path from the UV light source to the lithography target with light incident on the lithography target being substantially parallel;
wherein at least two of the first, second, and third mirrors are concave curved mirrors, the curvature of each of the two concave curved mirrors being different from each other.

2. The optical lithography system of claim 1, wherein the one or more of the mirrors is/are selected from spherical mirrors.

3. The optical lithography system of claim 1, further comprising at least a first and a second spherical mirrors, the curvature of the first spherical mirror being different from the curvature of the second spherical mirror, the curvature defined by different dimensions including a length (x) and a width (y) of a quadrilateral inscribed in a curved or substantially curved body of the mirrors, the longest diagonal line (a) and the shortest diagonal line (b) drawn between two opposite points on the largest periphery of the curved or substantially curved body of the spherical mirrors intersecting with each other at the center or central axis thereof, and an average height (h) from one side to another side of the curved or substantially curved body of the first and second spherical mirrors, the curved or substantially curved body of the first spherical mirror having a first length (x1), a first width (y1), a first longest diagonal line (a1), a first shortest diagonal line (b1), and a first average height (h1) different from a second or subsequent length (x2,3,4 . . . ), a second or subsequent width (y2,3,4 . . . ), a second or subsequent longest diagonal line (a2,3,4 . . . ), a second or subsequent shortest diagonal line (b2,3,4 . . . ), and a second or subsequent average height (h2,3,4 . . . ) of the second spherical mirror or subsequent spherical mirror to the second mirror.

4. The optical lithography system of claim 1, wherein the spiral light path is a substantially planar spiral.

5. The optical lithography system of claim 1, wherein the spiral light path is a three-dimensional spiral.

6. The optical lithography system of claim 1, wherein the average height (h1) of the first mirror is greater than the average height (h2,3,4 . . . ) of the second or subsequent mirror.

7. The optical lithography system of claim 1, wherein the plurality of mirrors includes at least four mirrors.

8. The optical lithography system of claim 7, wherein the length and width of the third mirror and the length and width of the fourth mirror are greater than the length and width of the second mirror, and wherein the length and width of the second mirror are greater than the length and width of the first mirror.

9. The optical lithography system of claim 7, wherein a first mirror of the plurality of mirrors has a first focal length which is smaller than a second focal length of a second mirror of the plurality of mirrors; the second focal length of the second mirror is smaller than a third focal length of a third mirror and a fourth focal length of a fourth mirror of the plurality of mirrors.

10. The optical lithography system of claim 9, wherein the first focal length of the first mirror is 50~200 mm; the second focal length of the second mirror is 1000~2000 mm; and the third focal length of the third mirror is 2500~3500 mm; and the fourth focal length of the fourth mirror is 2500~3500 mm.

11. The optical lithography system of claim 1, wherein one or more of light homogenizing modules are between mirrors.

12. The optical lithography system of claim 1, wherein the length and width of the two mirrors disposed at the closest to the exit of the polygonal structure are greater than the length and width of the other mirrors more distal to the exit of the polygonal structure.

13. The optical lithography system of claim 1, wherein input electrical power and/or light intensity of each UV LED, or of each UV LED module is/are adjustable.

14. The optical lithography system of claim 1, wherein the UV light source includes a cooling system.

15. The optical lithography system of claim 14, wherein the cooling system is a heat sink or a fluid-cooling module.

* * * * *